(12) United States Patent
Tripathi (10) Patent No.: US 10,873,304 B2
(45) Date of Patent: *Dec. 22, 2020

(54) POLE-SPLITTING AND FEEDFORWARD CAPACITORS IN COMMON MODE FEEDBACK OF FULLY DIFFERENTIAL AMPLIFIER

(71) Applicant: Samsung Electronics Co., Ltd., Suwon-si (KR)

(72) Inventor: Vaibhav Tripathi, San Jose, CA (US)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 16/785,304

(22) Filed: Feb. 7, 2020

(65) Prior Publication Data

US 2020/0177144 A1  Jun. 4, 2020

Related U.S. Application Data

(63) Continuation of application No. 16/041,686, filed on Jul. 20, 2018, now Pat. No. 10,594,278.

(60) Provisional application No. 62/555,010, filed on Sep. 6, 2017.

(51) Int. Cl.
*H03F 3/45* (2006.01)
*H03F 1/08* (2006.01)
*H03F 1/02* (2006.01)

(52) U.S. Cl.
CPC ....... *H03F 3/45659* (2013.01); *H03F 3/4565* (2013.01); *H03F 3/45188* (2013.01); *H03F 3/45704* (2013.01); *H03F 2203/45631* (2013.01)

(58) Field of Classification Search
USPC .................................. 330/252–261, 310–311
See application file for complete search history.

(56) References Cited

U.S. PATENT DOCUMENTS

| 6,018,268 A | 1/2000 | Tan |
| 6,281,751 B1 | 8/2001 | Maulik |
| 6,329,849 B1 | 12/2001 | Czarnul et al. |
| 9,479,120 B2 | 10/2016 | Cho et al. |
| 9,628,028 B2 | 4/2017 | Carrara et al. |
| 9,912,311 B2 | 3/2018 | Kang et al. |

(Continued)

FOREIGN PATENT DOCUMENTS

EP  2 312 751 A1  4/2011

*Primary Examiner* — Hieu P Nguyen
(74) *Attorney, Agent, or Firm* — Lewis Roca Rothgerber Christie LLP (57) ABSTRACT

An amplifier circuit. In some embodiments, the amplifier circuit includes: a telescopic amplifier, and a common mode feedback amplifier. The telescopic amplifier has a first signal input, a second signal input, a first output, a second output, a common mode feedback input, a first pole-splitting capacitor, and a second pole-splitting capacitor. The common mode feedback amplifier has an output connected to the common mode feedback input of the telescopic amplifier. The first pole-splitting capacitor is connected between the common mode feedback input of the telescopic amplifier and the first output of the telescopic amplifier, and the second pole-splitting capacitor is connected between the common mode feedback input of the telescopic amplifier and the second output of the telescopic amplifier.

19 Claims, 4 Drawing Sheets

(56) References Cited

U.S. PATENT DOCUMENTS

| | | | |
|---|---|---|---|
| 9,954,501 B2* | 4/2018 | Garbarino | ........... H03F 3/45179 |
| 2014/0002195 A1 | 1/2014 | Pellegrini | |
| 2018/0069513 A1 | 3/2018 | Kumar | |

* cited by examiner

POLE-SPLITTING AND FEEDFORWARD CAPACITORS IN COMMON MODE FEEDBACK OF FULLY DIFFERENTIAL AMPLIFIER

CROSS-REFERENCE TO RELATED APPLICATION(S)

This application is a continuation of U.S. patent application Ser. No. 16/041,686, filed on Jul. 20, 2018, which claims priority to and the benefit of U.S. Provisional Application No. 62/555,010, filed Sep. 6, 2017, entitled "SYSTEM AND METHOD FOR PROVIDING A TIME INTERLEAVED SUCCESSIVE APPROXIMATION ANALOG-TO-DIGITAL CONVERTER", the entire content of both of which is incorporated herein by reference.

FIELD

One or more aspects of embodiments according to the present disclosure relate to amplifiers, and more particularly to a differential amplifier with a common mode feedback loop.

BACKGROUND

A common mode feedback loop may be used in some applications to control the swing of the common mode component of the output of a differential amplifier. In some circuits, stability of the common mode feedback loop may be poor, however.

Thus, there is a need for an improved circuit for providing common mode feedback.

SUMMARY

According to an embodiment of the present disclosure there is provided an amplifier circuit, including: a telescopic amplifier, and a common mode feedback amplifier, the telescopic amplifier having: a first signal input, a second signal input, a first output, a second output, a common mode feedback input, a first pole-splitting capacitor, and a second pole-splitting capacitor, the common mode feedback amplifier having an output connected to the common mode feedback input of the telescopic amplifier, the first pole-splitting capacitor being connected between the common mode feedback input of the telescopic amplifier and the first output of the telescopic amplifier, and the second pole-splitting capacitor being connected between the common mode feedback input of the telescopic amplifier and the second output of the telescopic amplifier.

In one embodiment, the telescopic amplifier includes: a first cascode; a second cascode; and a load network, the first cascode including: a first transistor connected in a common-source configuration, the first transistor having a gate connected to the first signal input of the telescopic amplifier; and a second transistor connected in a common-gate configuration, the second transistor having a source connected to a drain of the first transistor of the first cascode and a drain connected to the first output of the telescopic amplifier; the second cascode including: a first transistor connected in a common-source configuration, the first transistor having a gate connected to the second signal input of the telescopic amplifier; and a second transistor connected in a common-gate configuration, the second transistor having a source connected to a drain of the first transistor of the second cascode and a drain connected to the second output of the telescopic amplifier; and the load network including the common mode feedback input and being connected to: the drain of the second transistor of the first cascode and the drain of the second transistor of the second cascode.

In one embodiment, the load network includes: a third cascode, a fourth cascode, a first load current source transistor, and a second load current source transistor, the third cascode including: a first transistor connected in a common-source configuration, the first transistor having a gate connected to the common mode feedback input of the telescopic amplifier; and a second transistor connected in a common-gate configuration, the second transistor having a source connected to a drain of the first transistor of the third cascode and a drain connected to the first output of the telescopic amplifier; the fourth cascode including: a first transistor connected in a common-source configuration, the first transistor having a gate connected to the common mode feedback input of the telescopic amplifier; and a second transistor connected in a common-gate configuration, the second transistor having a source connected to a drain of the first transistor of the fourth cascode and a drain connected to the second output of the telescopic amplifier; the first load current source transistor having a source connected to a first supply voltage and a drain connected to the drain of the first transistor of the third cascode; and the second load current source transistor having a source connected to the first supply voltage and a drain connected to the drain of the first transistor of the fourth cascode.

In one embodiment, the amplifier circuit includes: a first feedforward capacitor connected between the output of the common mode feedback amplifier and the first output of the amplifier circuit, and a second feedforward capacitor connected between the output of the common mode feedback amplifier and the second output of the amplifier circuit.

In one embodiment, the amplifier circuit includes a differential source follower, having: a first input connected to the first output of the telescopic amplifier, a second input connected to the second output of the telescopic amplifier, a first output connected to a first output of the amplifier circuit, and a second output connected to a second output of the amplifier circuit.

In one embodiment, the differential source follower includes a first arm and a second arm, the first arm including: a source follower transistor having a gate connected to the first output of the telescopic amplifier and a source connected to the first output of the amplifier circuit; and a current source transistor, having a source connected to a second supply voltage and a drain connected to the source of the source follower transistor of the first arm; the second arm including: a source follower transistor having a gate connected to the second output of the telescopic amplifier and a source connected to the second output of the amplifier circuit; and a current source transistor, having a source connected to the second supply voltage and a drain connected to the source of the source follower transistor of the second arm.

In one embodiment, the amplifier circuit includes: a first feedforward capacitor connected between the output of the common mode feedback amplifier and the first output of the amplifier circuit, and a second feedforward capacitor connected between the output of the common mode feedback amplifier and the second output of the amplifier circuit.

In one embodiment, the common mode feedback amplifier includes: a first arm and a second arm, the first arm including: a first transistor, connected in a common source configuration, and a second transistor, the second transistor being diode-connected, the second arm including: a first transistor, connected in a common source configuration, and a second transistor, the second transistor being diode-connected, a drain of the first transistor of the first arm being connected to a drain of the second transistor of the first arm, a drain of the first transistor of the second arm being connected to a drain of the second transistor of the second arm, a gate of the first transistor of the first arm being connected to an input of the common mode feedback amplifier, and the drain of the first transistor of the second arm being connected to the output of the common mode feedback amplifier.

In one embodiment, the amplifier circuit includes a resistive combiner connected to combine signals from: the first output of the amplifier circuit, and the second output of the amplifier circuit, the resistive combiner having an output connected to the input of the common mode feedback amplifier.

In one embodiment, the telescopic amplifier includes: a first cascode; a second cascode; and a load network, the first cascode including: a first transistor connected in a common-source configuration, the first transistor having a gate connected to the first signal input of the telescopic amplifier; and a second transistor connected in a common-gate configuration, the second transistor having a source connected to a drain of the first transistor of the first cascode and a drain connected to the first output of the telescopic amplifier; the second cascode including: a first transistor connected in a common-source configuration, the first transistor having a gate connected to the second signal input of the telescopic amplifier; and a second transistor connected in a common-gate configuration, the second transistor having a source connected to a drain of the first transistor of the second cascode and a drain connected to the second output of the telescopic amplifier; and the load network including the common mode feedback input and being connected to: the drain of the second transistor of the first cascode and the drain of the second transistor of the second cascode, wherein the load network further includes: a third cascode, a fourth cascode, a first load current source transistor, and a second load current source transistor, the third cascode including: a first transistor connected in a common-source configuration, the first transistor having a gate connected to the common mode feedback input of the telescopic amplifier; and a second transistor connected in a common-gate configuration, the second transistor having a source connected to a drain of the first transistor of the third cascode and a drain connected to the first output of the telescopic amplifier; the fourth cascode including: a first transistor connected in a common-source configuration, the first transistor having a gate connected to the common mode feedback input of the telescopic amplifier; and a second transistor connected in a common-gate configuration, the second transistor having a source connected to a drain of the first transistor of the fourth cascode and a drain connected to the second output of the telescopic amplifier; the first load current source transistor having a source connected to a first supply voltage and a drain connected to the drain of the first transistor of the third cascode; and the second load current source transistor having a source connected to the first supply voltage and a drain connected to the drain of the first transistor of the fourth cascode.

In one embodiment, the differential source follower includes a first arm and a second arm, the first arm including: a source follower transistor having a gate connected to the first output of the telescopic amplifier and a source connected to the first output of the amplifier circuit; and a current source transistor, having a source connected to a second supply voltage and a drain connected to the source of the source follower transistor of the first arm; the second arm including: a source follower transistor having a gate connected to the second output of the telescopic amplifier and a source connected to the second output of the amplifier circuit; and a current source transistor, having a source connected to the second supply voltage and a drain connected to the source of the source follower transistor of the second arm.

According to an embodiment of the present disclosure there is provided an amplifier circuit, including: a telescopic amplifier, a differential source follower, a common mode feedback amplifier, a first feedforward capacitor, and a second feedforward capacitor, the telescopic amplifier having: a first signal input, a second signal input, a first output, a second output, a common mode feedback input, the differential source follower having: a first input connected to the first output of the telescopic amplifier, a second input connected to the second output of the telescopic amplifier, a first output connected to a first output of the amplifier circuit, and a second output connected to a second output of the amplifier circuit the common mode feedback amplifier having an output connected to the common mode feedback input of the telescopic amplifier, the first feedforward capacitor being connected between the output of the common mode feedback amplifier and the first output of the amplifier circuit, and the second feedforward capacitor being connected between the output of the common mode feedback amplifier and the second output of the amplifier circuit.

In one embodiment, the amplifier circuit includes: a first pole-splitting capacitor, and a second pole-splitting capacitor, the first pole-splitting capacitor being connected between the common mode feedback input of the telescopic amplifier and the first output of the telescopic amplifier, and the second pole-splitting capacitor being connected between the common mode feedback input of the telescopic amplifier and the second output of the telescopic amplifier.

In one embodiment, the first pole-splitting capacitor and the second pole-splitting capacitor being present results in an increase in phase margin at a common mode unity-gain frequency of at least 10 degrees.

In one embodiment, the first feedforward capacitor and the second feedforward capacitor being present results in an increase in phase margin at a common mode unity-gain frequency of at least 10 degrees.

In one embodiment, the telescopic amplifier includes a first cascode; a second cascode; and a load network, the first cascode including: a first transistor connected in a common-source configuration, the first transistor having a gate connected to the first signal input of the telescopic amplifier; and a second transistor connected in a common-gate configuration, the second transistor having a source connected to a drain of the first transistor of the first cascode and a drain connected to the first output of the telescopic amplifier; the second cascode including: a first transistor connected in a common-source configuration, the first transistor having a gate connected to the second signal input of the telescopic amplifier; and a second transistor connected in a common-gate configuration, the second transistor having a source connected to a drain of the first transistor of the second cascode and a drain connected to the second output of the telescopic amplifier; and the load network including the common mode feedback input and being connected to: the drain of the second transistor of the first cascode and the drain of the second transistor of the second cascode.

In one embodiment, the load network includes: a third cascode, a fourth cascode, a first load current source transistor, and a second load current source transistor, the third cascode including: a first transistor connected in a common-source configuration, the first transistor having a gate connected to the common mode feedback input of the telescopic amplifier; and a second transistor connected in a common-gate configuration, the second transistor having a source connected to a drain of the first transistor of the third cascode and a drain connected to the first output of the telescopic amplifier; the fourth cascode including: a first transistor connected in a common-source configuration, the first transistor having a gate connected to the common mode feedback input of the telescopic amplifier; and a second transistor connected in a common-gate configuration, the second transistor having a source connected to a drain of the first transistor of the fourth cascode and a drain connected to the second output of the telescopic amplifier; the first load current source transistor having a source connected to a first supply voltage and a drain connected to the drain of the first transistor of the third cascode; and the second load current source transistor having a source connected to the first supply voltage and a drain connected to the drain of the first transistor of the fourth cascode.

In one embodiment, the differential source follower includes a first arm and a second arm, the first arm including: a source follower transistor having a gate connected to the first output of the telescopic amplifier and a source connected to the first output of the amplifier circuit; and a current source transistor, having a source connected to a second supply voltage and a drain connected to the source of the source follower transistor of the first arm; the second arm including: a source follower transistor having a gate connected to the second output of the telescopic amplifier and a source connected to the second output of the amplifier circuit; and a current source transistor, having a source connected to the second supply voltage and a drain connected to the source of the source follower transistor of the second arm.

In one embodiment, the common mode feedback amplifier includes: a first arm and a second arm, the first arm including: a first transistor, connected in a common source configuration, and a second transistor, the second transistor being diode-connected, the second arm including: a first transistor, connected in a common source configuration, and a second transistor, the second transistor being diode-connected, a drain of the first transistor of the first arm being connected to a drain of the second transistor of the first arm, a drain of the first transistor of the second arm being connected to a drain of the second transistor of the second arm, a gate of the first transistor of the first arm being connected to an input of the common mode feedback amplifier, and the drain of the first transistor of the second arm being connected to the output of the common mode feedback amplifier.

In one embodiment, the amplifier circuit includes a resistive combiner connected to combine signals from: the first output of the amplifier circuit, and the second output of the amplifier circuit, the resistive combiner having an output connected to the input of the common mode feedback amplifier.

BRIEF DESCRIPTION OF THE DRAWINGS

These and other features and advantages of the present disclosure will be appreciated and understood with reference to the specification, claims, and appended drawings wherein:

DETAILED DESCRIPTION

The detailed description set forth below in connection with the appended drawings is intended as a description of exemplary embodiments of a fully differential amplifier including common mode feedback with pole-splitting and feedforward capacitors provided in accordance with the present disclosure and is not intended to represent the only forms in which the present disclosure may be constructed or utilized. The description sets forth the features of the present disclosure in connection with the illustrated embodiments. It is to be understood, however, that the same or equivalent functions and structures may be accomplished by different embodiments that are also intended to be encompassed within the scope of the disclosure. As denoted elsewhere herein, like element numbers are intended to indicate like elements or features.

Figure 1:
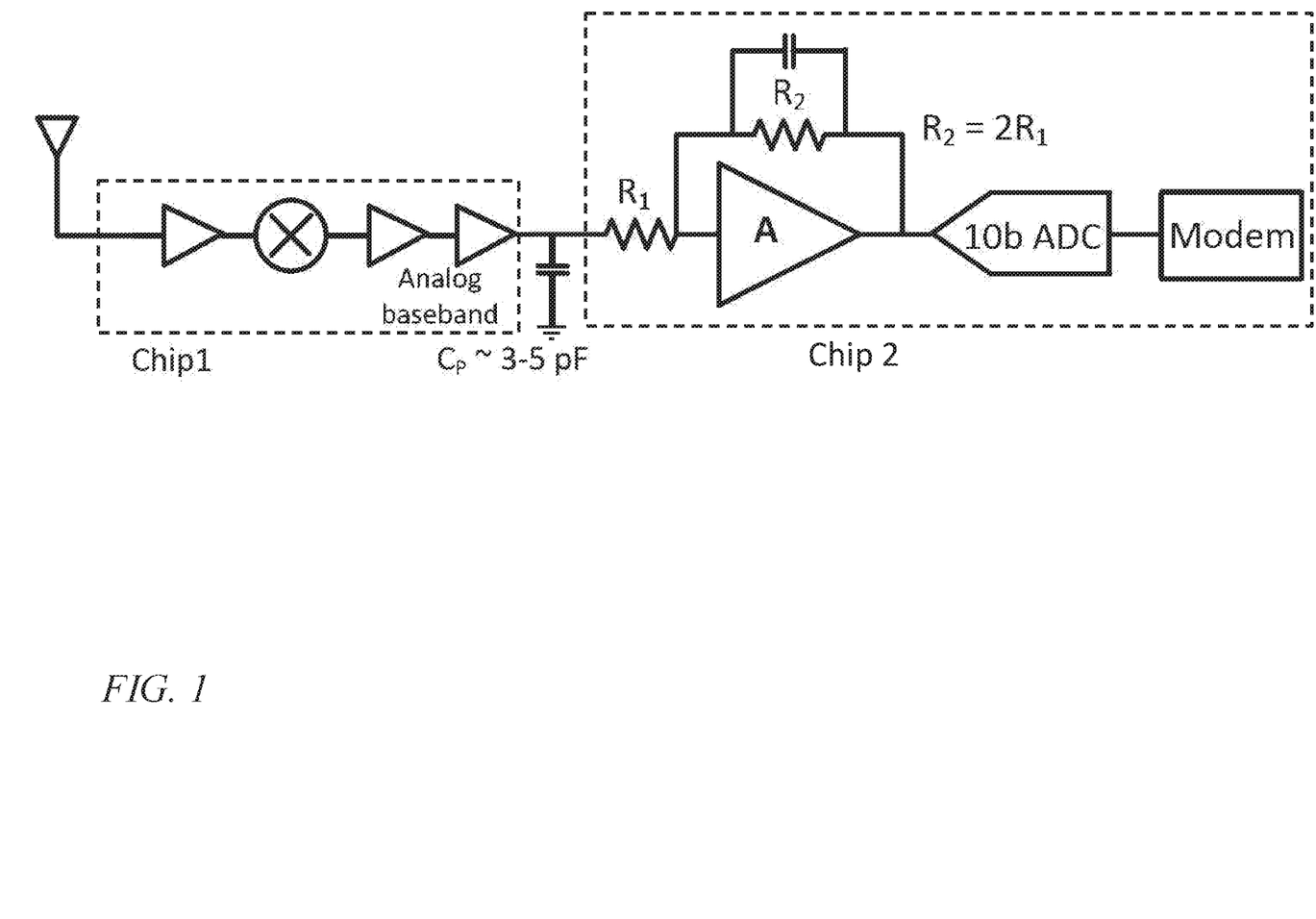
FIG. 1 is a block diagram of a signal chain, according to an embodiment of the present disclosure.

FIG. 1 shows a 5G signal chain, in one embodiment. In this embodiment a fully differential amplifier receives and amplifies an analog baseband signal generated by a first chip (Chip 1), which receives an RF (or mm-wave) signal from an antenna, amplifies it, and mixes it down to baseband. The output of the fully differential amplifier feeds a 10-bit analog to digital converter which digitizes the analog baseband signal and sends the digitized signal to a modem.

Figure 2:
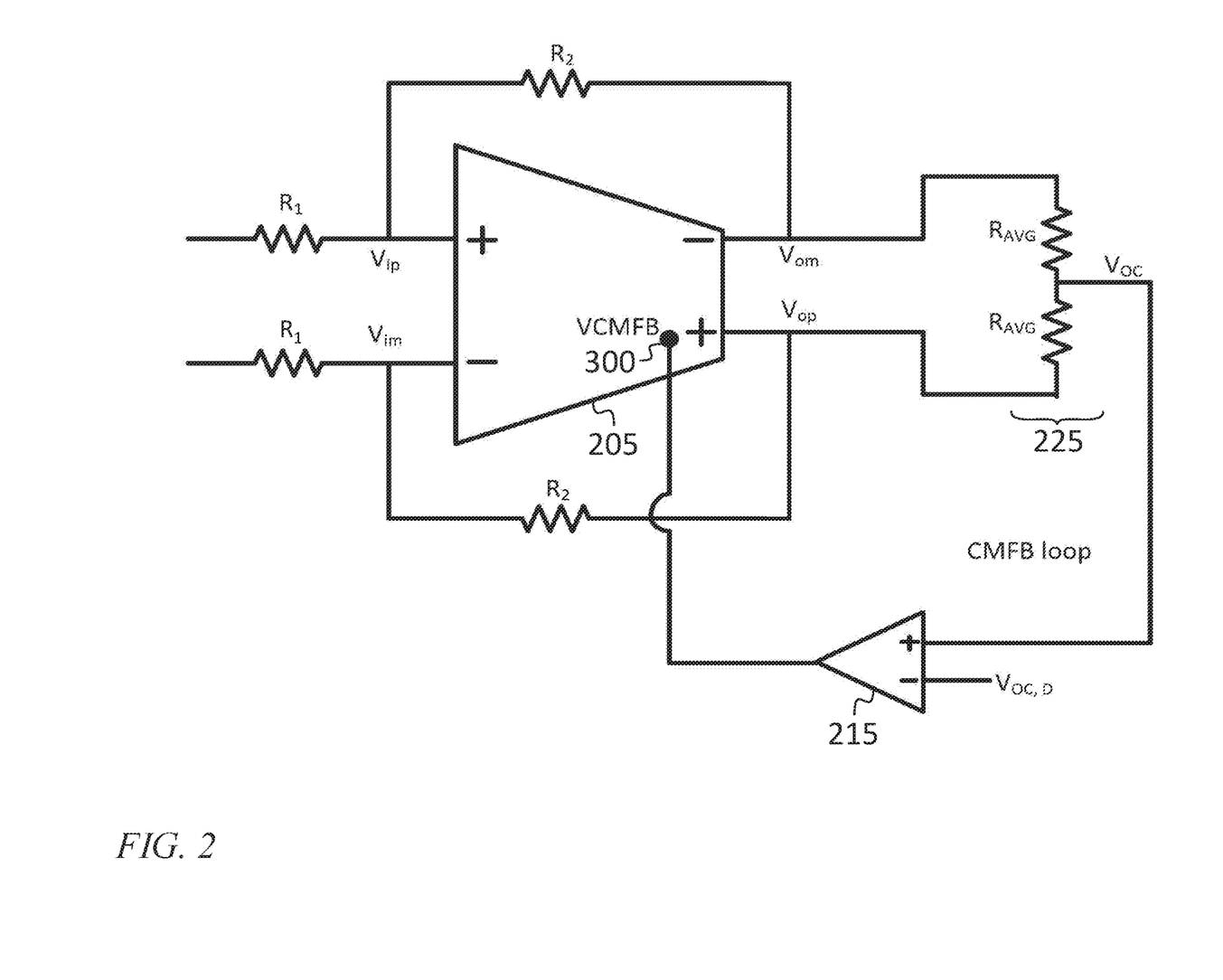
FIG. 2 is a schematic diagram of differential amplifier with common mode feedback, according to an embodiment of the present disclosure.

Referring to FIG. 2, in some embodiments the fully differential amplifier circuit includes a differential amplifier 205 and a common mode feedback (CMFB) loop. Such a loop may act to maintain the common mode component of the output signal near zero, to avoid a large common mode signal that may result in degradation of the performance of the amplifier. The common mode feedback loop includes a common mode feedback amplifier 215 having an input connected to a resistive combiner 225 (which averages signals from the two outputs of the differential amplifier 205), and an output connected to a common mode feedback input 300 of the differential amplifier 205.

Figure 3:
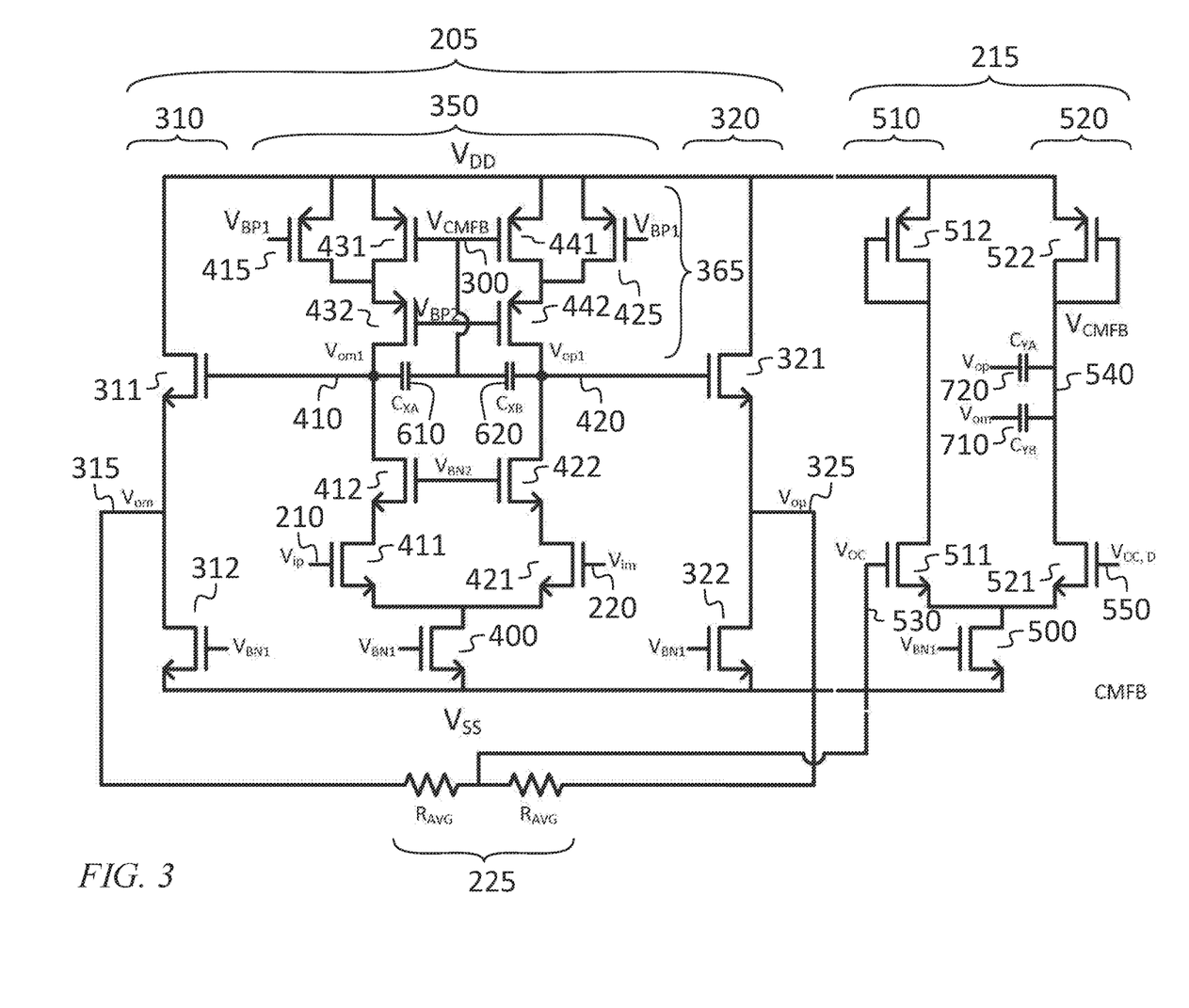
FIG. 3 is a schematic diagram of differential amplifier with common mode feedback, according to an embodiment of the present disclosure.

Referring to FIG. 3, in some embodiments the fully-differential amplifier 205 includes a first stage that may be a telescopic amplifier 350, followed by a second stage that may be a differential source follower including a first arm 310 and a second arm 320. The amplifier circuit further includes a common mode feedback amplifier 215, as mentioned above. In some embodiments, the differential source follower may be part of the common mode feedback amplifier, instead of being part of the fully differential amplifier, or it may be absent entirely.

In some embodiments, the telescopic amplifier 350 has (i) a differential input including a first signal input 210 and a second signal input 220, (ii) a differential output including a first output 410 and a second output 420, and (iii) a common mode feedback input 300. The telescopic amplifier 350 is a differential cascode amplifier with a differential cascode current mirror load and a tail current source. The telescopic amplifier 350 includes (i) a first cascode (which may be a positive NMOS cascode amplifier, as shown) and a second cascode (which may be a negative NMOS cascode amplifier, as shown), together forming a differential cascode amplifier, (ii) a cascode current mirror load 365, connected as a load for the differential cascode amplifier, and (iii) a tail current source 400 of the differential cascode amplifier, as discussed in further detail below. As used herein, a "cascode" consists of two transistors, one of which is connected in a common-source configuration, and the other of which is connected in a common-gate configuration; the source of the transistor that is connected in a common-gate configuration is connected to the drain of the transistor that is connected in a common-source configuration. The first cascode consists of a first transistor 411 and a second transistor 412. The first transistor 411 of the first cascode is connected in a common-source configuration, and has a gate connected to the first signal input 210 of the telescopic amplifier 350. The second transistor 412 of the first cascode is connected in a common-gate configuration, and has a source connected to a drain of the first transistor 411 of the first cascode and a drain connected to the first output 410 of the telescopic amplifier 350.

The second cascode consists of a first transistor 421 and a second transistor 422. The first transistor 421 of the second cascode is connected in a common-source configuration, and has a gate connected to the second signal input 220 of the telescopic amplifier 350. The second transistor 422 of the second cascode is connected in a common-gate configuration, and has a source connected to the drain of the first transistor 421 of the second cascode and a drain connected to the second output 420 of the telescopic amplifier 350.

In some embodiments, the cascode current mirror load 365 includes a third cascode (which may be a positive PMOS cascode amplifier, as shown), a fourth cascode (which may be a negative PMOS cascode amplifier, as shown), a first load current source transistor 415, and a second load current source transistor 425. The third cascode may include a first transistor 431 and a second transistor 432. The first transistor 431 of the third cascode may be connected in a common-source configuration, and have a gate connected to the common mode feedback input 300 of the telescopic amplifier 350. The second transistor 432 of the third cascode may be connected in a common-gate configuration, and have a source connected to the drain of the first transistor 431 of the third cascode and a drain connected to the first output 410 of the telescopic amplifier 350.

The fourth cascode may include a first transistor 441 and a second transistor 442. The first transistor 441 of the fourth cascode may be connected in a common-source configuration, and have a gate connected to the common mode feedback input 300 of the telescopic amplifier 350. The second transistor 442 of the fourth cascode may be connected in a common-gate configuration, and have a source connected to the drain of the first transistor 441 of the fourth cascode and a drain connected to the second output 420 of the telescopic amplifier 350.

The first load current source transistor 415 may have a source connected to a first supply voltage (e.g., a positive supply voltage, which may be referred to as Vdd) and a drain connected to the drain of the first transistor 431 of the third cascode. The second load current source transistor 425 may have a source connected to the first supply voltage and a drain connected to the drain of the first transistor 441 of the fourth cascode.

All of the transistors of the first cascode and of the second cascode may be N-channel metal oxide semiconductor field effect transistors (MOSFETs) (or "NMOS transistors"). The respective sources of each of the first transistor 411 of the first cascode and the first transistor 421 of the second cascode may be connected to a common node or "tail" of the differential cascode amplifier, which may be connected to a second supply voltage (e.g., a supply voltage, which may be referred to as Vss, that is lower than the first supply voltage) through a tail current source 400 of the differential cascode amplifier.

The differential source follower that may act as the second stage of the fully-differential amplifier 205 may include, as mentioned above, a first arm 310 and a second arm 320. The first arm 310 of the differential source follower may include a source follower transistor 311 and a current source transistor 312. The source follower transistor 311 of the first arm 310 may have a gate connected to the first output 410 of the telescopic amplifier 350 and a source connected to a first output 315 of the amplifier circuit. The current source transistor 312 of the first arm 310 may have a source connected to the second supply voltage and a drain connected to the source of the source follower transistor 311 of the first arm 310.

The second arm 320 of the differential source follower may include a source follower transistor 321 and a current source transistor 322. The source follower transistor 321 of the second arm 320 may have a gate connected to the second output 420 of the telescopic amplifier 350 and a source connected to a second output 325 of the amplifier circuit. The current source transistor 322 of the second arm 320 may have a source connected to the second supply voltage and a drain connected to the source of the source follower transistor 321 of the second arm 320.

The common mode feedback amplifier 215 may include a first arm 510 and a second arm 520, together forming a differential pair, with a pair of diode-connected transistors acting as a differential load for the differential pair. The first arm 510 of the common mode feedback amplifier 215 may include a first transistor 511 and a second transistor 512. The first transistor 511 of the first arm 510 of the common mode feedback amplifier 215 may be connected in a common source configuration, and the second transistor 512 of the first arm 510 of the common mode feedback amplifier 215 may be diode-connected. The drain of the first transistor 511 of the first arm 510 of the common mode feedback amplifier 215 may be connected to the drain of the second transistor 512 of the first arm 510 of the common mode feedback amplifier 215.

The second arm 520 of the common mode feedback amplifier 215 may include a first transistor 521 and a second transistor 522. The first transistor 521 of the second arm 520 of the common mode feedback amplifier 215 may be connected in a common source configuration, and the second transistor 522 of the second arm 520 of the common mode feedback amplifier 215 may be diode-connected. The drain of the first transistor 521 of the second arm 520 of the common mode feedback amplifier 215 may be connected to the drain of the second transistor 522 of the second arm 520 of the common mode feedback amplifier 215.

The gate of the first transistor 511 of the first arm 510 of the common mode feedback amplifier 215 may be connected to an input 530 of the common mode feedback amplifier 215, and the drain of the first transistor 521 of the second arm 520 of the common mode feedback amplifier 215 may be connected to the output 540 of the common mode feedback amplifier 215. The source of each of the first transistor 511 of the first arm 510 of the common mode feedback amplifier 215 and the first transistor 521 of the second arm 520 of the common mode feedback amplifier 215 may be connected to a common node or "tail" of the common mode feedback amplifier 215, which may be connected to the second supply voltage through a current source transistor 500 of the common mode feedback amplifier 215. The gate 550 of the first transistor 521 of the second arm 520 of the common mode feedback amplifier 215 is connected to a voltage reference that acts as a setpoint for the common mode feedback loop.

Several of the n-channel MOSFETs of the circuit may have their gates connected to one of two different bias voltages referred to herein (because they are used to bias n-channel MOSFETs) as "n-bias" voltages, and several of the p-channel MOSFETs (or "PMOS transistors") of the circuit may have their gates connected to one of two different bias voltages referred to herein, for an analogous reason, as "p-bias" voltages. These n-bias voltages and p-bias voltages may be produced by suitably configured current mirror reference transistors (with the transistors to which the bias voltages are applied acting as the mirror transistors).

For example, in some embodiments, the gates of various transistors are connected to bias voltages as follows. The gate of the tail current source 400 of the differential cascode amplifier, the gate of the current source transistor 312 of the first arm 310 of the differential source follower, the gate of the current source transistor 322 of the second arm 320 of the differential source follower, and the gate of the current source transistor 500 of the common mode feedback amplifier 215 are connected to a first n-bias voltage. The gate of the second transistor 412 of the first cascode and the gate of the second transistor 422 of the second cascode are connected to a second n-bias voltage. The gate of the first load current source transistor 415 of the cascode current mirror load 365 and the gate of the second load current source transistor 425 of the cascode current mirror load 365 are connected to a first p-bias voltage, and the gate of the second transistor 432 of the third cascode and the gate of the second transistor 442 of the fourth cascode are connected to a second p-bias voltage.

The fully-differential amplifier 205 may operate from a 1.8 V supply voltage. The fully-differential amplifier 205 may have a high-frequency non-dominant pole, and explicit compensation may not be required in the differential feedback loop. Absent suitable measures, however, the stability of the common-mode feedback loop may be poor, or the common-mode feedback loop may be unstable.

Accordingly, capacitors may be used to improve the phase margin of the common-mode feedback loop. In some embodiments, the amplifier circuit includes, for example, a first pole-splitting capacitor 610 and a second pole-splitting capacitor 620. The first pole-splitting capacitor 610 is connected between the common mode feedback input 300 of the telescopic amplifier 350 and the first output 410 of the telescopic amplifier 350, and the second pole-splitting capacitor 620 is connected between the common mode feedback input 300 of the telescopic amplifier 350 and the second output 420 of the telescopic amplifier 350. These capacitors split the poles in the two pole-pairs. The two poles of each pair of poles are (i) at the output 540 of the common mode feedback amplifier 215 and (ii) at the outputs 410, 420 of the telescopic amplifier 350. The presence of the pole-splitting capacitors 610, 620 pushes the first of these two poles to lower frequency and pushes the second of these two poles to higher frequencies, which improves phase margin and hence stability. In some embodiments, however, the pole-splitting capacitors 610, 620 load the differential feedback loop, and the pole-splitting capacitors 610, 620 may therefore be chosen such that the resulting bandwidth degradation is less than 10%. The pole-splitting capacitors 610, 620 may be implemented using a metal-oxide-metal (MOM) structure.

Further, feedforward compensation may be provided by a first feedforward capacitor 710 connected between the output 540 of the common mode feedback amplifier and the first output 315 of the amplifier circuit, and a second feedforward capacitor 720 connected between the output 540 of the common mode feedback amplifier and the second output 325 of the amplifier circuit. The presence of the feedforward capacitors 710, 720 may further improve common mode feedback loop stability and may ensure a robust design across process and temperature. The feedforward capacitors 710, 720 may also be implemented using a metal-oxide-metal (MOM) structure.

Figure 4:
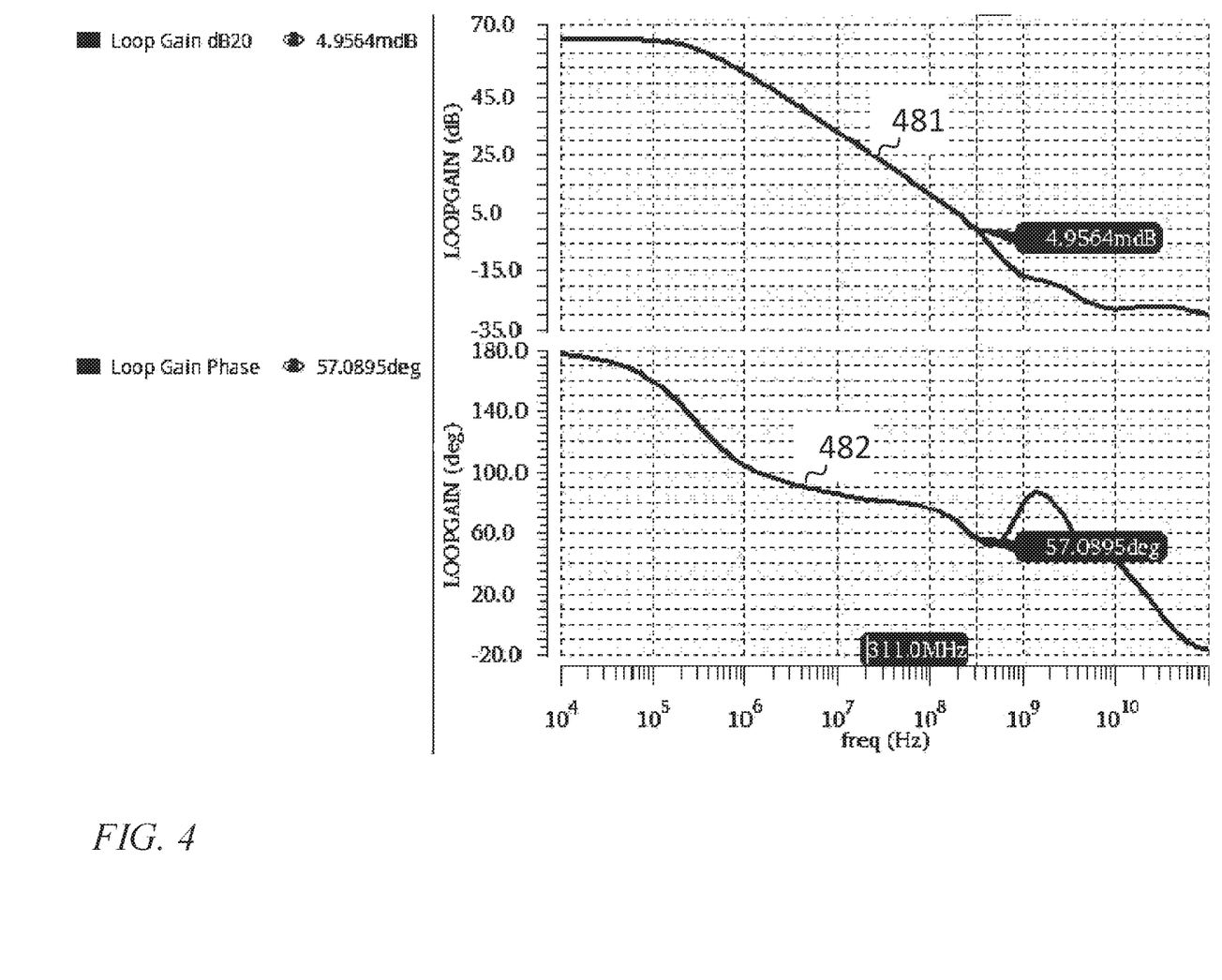
FIG. 4 is a graph of loop gain magnitude and loop gain phase, according to an embodiment of the present disclosure.

In some embodiments a common mode feedback amplifier according to the circuit of FIG. 3 consumes only 50 uA of current and has a loop bandwidth of over 300 MHz. FIG. 4 shows plots of loop gain magnitude (in a first curve 481) and loop gain phase (in a second curve 482) according to one embodiment. Together, the presence of both the pole-splitting capacitors 610, 620 and the feedforward capacitors 710, 720 may result in a common mode feedback loop phase margin exceeding 55 degrees, as shown in FIG. 4. The capacitance values and device sizes may depend on the target amplifier bandwidth and power consumption. In some embodiments, the capacitor values may be of the order of 10s of fF for the feedforward capacitors and 50-100 fF for the pole-splitting capacitors.

Some embodiments are described herein as being constructed of field effect transistors, but it will be understood that in some embodiments other transistors (e.g., bipolar transistors) may be used instead, or as well, to similar effect. As used herein, the two principal terminals of a transistor (e.g., the source and the drain, for a MOSFET, or the collector and the emitter, for a bipolar transistor) may be referred to as the "main" terminals of the transistor, and the terminal used to control the transistor (e.g., the gate, for a MOSFET, or the base, for a bipolar transistor) may be referred to as the "control" terminal of the transistor. As used herein, when the connections to a transistor are described with terminology used for two-terminal devices, it is the connections to the main terminals of the transistor that are described. For example, a transistor that is "connected between" two nodes of a circuit has a first one of the main terminals of the transistor connected to a first one of the two nodes and a second one of the main terminals of the transistor connected to a second one of the two nodes. As another example, when two transistors are said to be connected "in series" (as in the case of a CMOS inverter), a main terminal of one of the two transistors is connected to a main terminal of the other of the two transistors. As used herein the "gate" of a bipolar transistor means the base of the bipolar transistor the "source" of a bipolar transistor means the emitter of the bipolar transistor, and the "drain" of a bipolar transistor means the collector of the bipolar transistor.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed herein could be termed a second element, component, region, layer or section, without departing from the spirit and scope of the inventive concept.

Spatially relative terms, such as "beneath", "below", "lower", "under", "above", "upper" and the like, may be used herein for ease of description to describe one element or feature's relationship to another element(s) or feature(s) as illustrated in the figures. It will be understood that such spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the inventive concept. As used herein, the terms "substantially," "about," and similar terms are used as terms of approximation and not as terms of degree, and are intended to account for the inherent deviations in measured or calculated values that would be recognized by those of ordinary skill in the art.

As used herein, the singular forms "a" and "an" are intended to include the plural forms as well, unless the context clearly indicates otherwise. It will be further understood that the terms "comprises" and/or "comprising", when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list. Further, the use of "may" when describing embodiments of the inventive concept refers to "one or more embodiments of the present disclosure". Also, the term "exemplary" is intended to refer to an example or illustration. As used herein, the terms "use," "using," and "used" may be considered synonymous with the terms "utilize," "utilizing," and "utilized," respectively.

It will be understood that when an element or layer is referred to as being "on", "connected to", "coupled to", or "adjacent to" another element or layer, it may be directly on, connected to, coupled to, or adjacent to the other element or layer, or one or more intervening elements or layers may be present. In contrast, when an element or layer is referred to as being "directly on", "directly connected to", "directly coupled to", or "immediately adjacent to" another element or layer, there are no intervening elements or layers present.

Any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein.

Although exemplary embodiments of a fully differential amplifier including common mode feedback with pole-splitting and feedforward capacitors have been specifically described and illustrated herein, many modifications and variations will be apparent to those skilled in the art. Accordingly, it is to be understood that a fully differential amplifier including common mode feedback with pole-splitting and feedforward capacitors constructed according to principles of this disclosure may be embodied other than as specifically described herein. The invention is also defined in the following claims, and equivalents thereof.

What is claimed is:

1. An amplifier circuit, comprising:
  a differential amplifier comprising:
    a first pole-splitting capacitor connected between a common mode feedback input of the differential amplifier and a first output of the differential amplifier; and
    a second pole-splitting capacitor connected between the common mode feedback input and a second output of the differential amplifier;
  a common mode feedback amplifier comprising an output connected to the common mode feedback input; and
  a differential source follower comprising an input connected to the differential amplifier and an output connected to an output of the amplifier circuit.

2. The amplifier circuit of claim 1, wherein the differential amplifier is a telescopic amplifier.

3. The amplifier circuit of claim 1, further comprising:
  a first feedforward capacitor connected between the output of the common mode feedback amplifier and a first output of the amplifier circuit; and
  a second feedforward capacitor connected between the output of the common mode feedback amplifier and a second output of the amplifier circuit.

4. The amplifier circuit of claim 3, further comprising wherein the differential source follower comprises:
  a second amplifier comprising:
    a first input connected to the first output of the differential amplifier,
    a second input connected to the second output of the differential amplifier,
    a first output connected to the first output of the amplifier circuit, and
    a second output connected to the second output of the amplifier circuit.

5. The amplifier circuit of claim 4, wherein the second amplifier comprises a first arm and a second arm,
  the first arm comprising:
    a source follower transistor having a gate connected to the first output of the differential amplifier and a source connected to the first output of the amplifier circuit; and
    a current source transistor, having a source connected to a second supply voltage and a drain connected to the source of the source follower transistor of the first arm;
  the second arm comprising:
    a source follower transistor having a gate connected to the second output of the differential amplifier and a source connected to the second output of the amplifier circuit; and a current source transistor, having a source connected to the second supply voltage and a drain connected to the source of the source follower transistor of the second arm.

6. The amplifier circuit of claim 4, wherein the common mode feedback amplifier comprises:
a first arm and a second arm,
the first arm comprising:
a first transistor, connected in a common source configuration, and
a second transistor, the second transistor being diode-connected,
the second arm comprising:
a first transistor, connected in a common source configuration, and
a second transistor, the second transistor being diode-connected,
a drain of the first transistor of the first arm being connected to a drain of the second transistor of the first arm,
a drain of the first transistor of the second arm being connected to a drain of the second transistor of the second arm,
a gate of the first transistor of the first arm being connected to an input of the common mode feedback amplifier, and
the drain of the first transistor of the second arm being connected to the output of the common mode feedback amplifier.

7. The amplifier circuit of claim 6, further comprising a resistive combiner connected to combine signals from:
the first output of the amplifier circuit, and
the second output of the amplifier circuit,
the resistive combiner having an output connected to the input of the common mode feedback amplifier.

8. An amplifier circuit, comprising:
a differential amplifier comprising:
a first pole-splitting capacitor connected between a common mode feedback input of the differential amplifier and a first output of the differential amplifier; and
a second pole-splitting capacitor connected between the common mode feedback input and a second output of the differential amplifier; and
a common mode feedback amplifier comprising an output connected to the common mode feedback input,
wherein the differential amplifier comprises:
a first cascode;
a second cascode; and
a load network,
the first cascode comprising:
a first transistor connected in a common-source configuration, the first transistor having a gate connected to a first signal input of the differential amplifier; and
a second transistor connected in a common-gate configuration, the second transistor having a source connected to a drain of the first transistor of the first cascode and a drain connected to the first output of the differential amplifier;
the second cascode comprising:
a first transistor connected in a common-source configuration, the first transistor having a gate connected to a second signal input of the differential amplifier; and
a second transistor connected in a common-gate configuration, the second transistor having a source connected to a drain of the first transistor of the second cascode and a drain connected to the second output of the differential amplifier; and
the load network comprising the common mode feedback input and being connected to:
the drain of the second transistor of the first cascode and
the drain of the second transistor of the second cascode.

9. The amplifier circuit of claim 8, wherein the load network comprises:
a third cascode,
a fourth cascode,
a first load current source transistor, and
a second load current source transistor,
the third cascode comprising:
a first transistor connected in a common-source configuration, the first transistor having a gate connected to the common mode feedback input of the differential amplifier; and
a second transistor connected in a common-gate configuration, the second transistor having a source connected to a drain of the first transistor of the third cascode and a drain connected to the first output of the differential amplifier;
the fourth cascode comprising:
a first transistor connected in a common-source configuration, the first transistor having a gate connected to the common mode feedback input of the differential amplifier; and
a second transistor connected in a common-gate configuration, the second transistor having a source connected to a drain of the first transistor of the fourth cascode and a drain connected to the second output of the differential amplifier;
the first load current source transistor having a source connected to a first supply voltage and a drain connected to the drain of the first transistor of the third cascode; and
the second load current source transistor having a source connected to the first supply voltage and a drain connected to the drain of the first transistor of the fourth cascode.

10. An amplifier circuit, comprising:
a differential amplifier comprising a common mode feedback input;
a second amplifier comprising:
a first input connected to a first output of the differential amplifier;
a second input connected to a second output of the differential amplifier;
a first output connected to a first output of the amplifier circuit; and
a second output connected to a second output of the amplifier circuit;
a common mode feedback amplifier comprising an output connected to the common mode feedback input;
a first feedforward capacitor connected between the output of the common mode feedback amplifier and the first output of the amplifier circuit;
a second feedforward capacitor connected between the output of the common mode feedback amplifier and the second output of the amplifier circuit; and
a first pole-splitting capacitor connected between the common mode feedback input and the first output of the differential amplifier, wherein the second amplifier is a differential source follower.

11. The amplifier circuit of claim 10, wherein the differential amplifier is a telescopic amplifier.

12. The amplifier circuit of claim 10, further comprising:
a second pole-splitting capacitor connected between the common mode feedback input and the second output of the differential amplifier.

13. The amplifier circuit of claim 12, wherein the first pole-splitting capacitor and the second pole-splitting capacitor being present results in an increase in phase margin at a common mode unity-gain frequency of at least 10 degrees.

14. The amplifier circuit of claim 12, wherein the first feedforward capacitor and the second feedforward capacitor being present results in an increase in phase margin at a common mode unity-gain frequency of at least 10 degrees.

15. The amplifier circuit of claim 14, wherein the differential amplifier comprises:
a first cascode;
a second cascode; and
a load network,
the first cascode comprising:
   a first transistor connected in a common-source configuration, the first transistor having a gate connected to a first signal input of the differential amplifier; and
   a second transistor connected in a common-gate configuration, the second transistor having a source connected to a drain of the first transistor of the first cascode and a drain connected to the first output of the differential amplifier;
the second cascode comprising:
   a first transistor connected in a common-source configuration, the first transistor having a gate connected to a second signal input of the differential amplifier; and
   a second transistor connected in a common-gate configuration, the second transistor having a source connected to a drain of the first transistor of the second cascode and a drain connected to the second output of the differential amplifier; and
the load network comprising the common mode feedback input and being connected to:
   the drain of the second transistor of the first cascode and
   the drain of the second transistor of the second cascode.

16. The amplifier circuit of claim 15, wherein the load network comprises:
a third cascode,
a fourth cascode,
a first load current source transistor, and
a second load current source transistor,
the third cascode comprising:
   a first transistor connected in a common-source configuration, the first transistor having a gate connected to the common mode feedback input; and
   a second transistor connected in a common-gate configuration, the second transistor having a source connected to a drain of the first transistor of the third cascode and a drain connected to the first output of the differential amplifier;
the fourth cascode comprising:
   a first transistor connected in a common-source configuration, the first transistor having a gate connected to the common mode feedback input; and
   a second transistor connected in a common-gate configuration, the second transistor having a source connected to a drain of the first transistor of the fourth cascode and a drain connected to the second output of the differential amplifier;
the first load current source transistor having a source connected to a first supply voltage and a drain connected to the drain of the first transistor of the third cascode; and
the second load current source transistor having a source connected to the first supply voltage and a drain connected to the drain of the first transistor of the fourth cascode.

17. The amplifier circuit of claim 16, wherein the second amplifier comprises a first arm and a second arm,
the first arm comprising:
   a source follower transistor having a gate connected to the first output of the differential amplifier and a source connected to the first output of the amplifier circuit; and
   a current source transistor, having a source connected to a second supply voltage and a drain connected to the source of the source follower transistor of the first arm;
the second arm comprising:
   a source follower transistor having a gate connected to the second output of the differential amplifier and a source connected to the second output of the amplifier circuit; and
   a current source transistor, having a source connected to the second supply voltage and a drain connected to the source of the source follower transistor of the second arm.

18. The amplifier circuit of claim 17, wherein the common mode feedback amplifier comprises:
a first arm and a second arm,
the first arm comprising:
   a first transistor, connected in a common source configuration, and
   a second transistor, the second transistor being diode-connected,
the second arm comprising:
   a first transistor, connected in a common source configuration, and
   a second transistor, the second transistor being diode-connected,
a drain of the first transistor of the first arm being connected to a drain of the second transistor of the first arm,
a drain of the first transistor of the second arm being connected to a drain of the second transistor of the second arm,
a gate of the first transistor of the first arm being connected to an input of the common mode feedback amplifier, and
the drain of the first transistor of the second arm being connected to the output of the common mode feedback amplifier.

19. The amplifier circuit of claim 18, further comprising a resistive combiner connected to combine signals from:
the first output of the amplifier circuit, and
the second output of the amplifier circuit,
the resistive combiner comprising an output connected to the input of the common mode feedback amplifier.

* * * * *